United States Patent
Sun et al.

(10) Patent No.: US 7,116,572 B2
(45) Date of Patent: Oct. 3, 2006

(54) CIRCUIT FOR GENERATING A CENTERED REFERENCE VOLTAGE FOR A 1T/1C FERROELECTRIC MEMORY

(75) Inventors: Shan Sun, Colorado Springs, CO (US); Xiao-Hong Du, Colorado Springs, CO (US); Fan Chu, Colorado Springs, CO (US); Bob Sommervold, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 85 days.

(21) Appl. No.: 10/984,065

(22) Filed: Nov. 9, 2004

(65) Prior Publication Data

US 2006/0098470 A1 May 11, 2006

(51) Int. Cl.
*G11C 11/22* (2006.01)
(52) U.S. Cl. .................... 365/145; 365/149; 438/3
(58) Field of Classification Search ............. 365/145, 365/149; 438/3
See application file for complete search history.

(56) References Cited

U.S. PATENT DOCUMENTS

| | | | | |
|---|---|---|---|---|
| 5,086,412 A | * | 2/1992 | Jaffe et al. ............... | 365/145 |
| 5,262,982 A | * | 11/1993 | Brassington et al. ....... | 365/145 |
| 5,270,967 A | * | 12/1993 | Moazzami et al. ......... | 365/145 |
| 5,508,954 A | * | 4/1996 | Mihara et al. ............. | 365/145 |
| 5,572,459 A | | 11/1996 | Wilson et al. | |
| 5,751,626 A | * | 5/1998 | Seyyedy ................... | 365/145 |
| 5,822,237 A | | 10/1998 | Wilson et al. | |
| 5,880,989 A | | 3/1999 | Wilson et al. | |
| 5,956,266 A | | 9/1999 | Wilson et al. | |
| 5,986,919 A | | 11/1999 | Allen et al. | |
| 6,008,659 A | * | 12/1999 | Traynor .................... | 324/658 |
| 6,252,793 B1 | | 6/2001 | Allen et al. | |
| 6,272,039 B1 | * | 8/2001 | Clemens et al. ........... | 365/154 |
| 2003/0002368 A1 | * | 1/2003 | Kang et al. ................ | 365/201 |
| 2005/0231997 A1 | * | 10/2005 | Rodriguez et al. .......... | 365/145 |

\* cited by examiner

*Primary Examiner*—Richard Elms
*Assistant Examiner*—Eric J. Wendler
(74) *Attorney, Agent, or Firm*—Hogan & Hartson L.L.P.

(57) ABSTRACT

A ferroelectric reference circuit generates a reference voltage proportional to (P+U)/2 and is automatically centered between the bit line voltages corresponding to the P term and the U term across wide temperature and voltage ranges. To avoid fatiguing the reference ferroelectric capacitors generating (P+U)/2, the reference voltage is refreshed once every millisecond. To eliminate the variation of the reference voltage due to the leakage in the ferroelectric capacitors during this period of time, the reference voltage generated from the reference ferroelectric capacitors is digitized when it is refreshed. The digital value is fixed and converted to an analog value which is then fed into sense amplifiers for resolving the data states. The reference voltage is automatically at the center of the switching (P) and non-switching (U) signals and therefore the signal margin is maximized.

12 Claims, 3 Drawing Sheets

CIRCUIT FOR GENERATING A CENTERED REFERENCE VOLTAGE FOR A 1T/1C FERROELECTRIC MEMORY

BACKGROUND OF THE INVENTION

The present invention relates, in general, to the field of ferroelectric memories. More particularly, the present invention relates to a reference circuit and method for providing a reference voltage suitable for use with 1T/1C ferroelectric memory architectures.

Ferroelectric memory architectures and reference circuits, such as 1T/1C memory architectures and corresponding reference circuits, are known in the art. An example of a 1T/1C memory architecture is described in U.S. Pat. No. 5,880,989, entitled "Sensing Methodology for a 1T/1C Ferroelectric Memory, assigned to the current assignee, and hereby incorporated in its entirety by this reference. In addition to the 1T/1C memory architecture described therein, at least one reference scheme is shown as well.

One type of ferroelectric reference cell uses one or more charge components of a ferroelectric capacitor as the basis of the reference voltage. The operation of a ferroelectric capacitor is described with reference to the hysteresis FIG. 40 and corresponding voltage diagram shown in FIGS. 1 and 2. FIG. 1 is a plot of the voltage versus charge or polarization of a ferroelectric capacitor. While reference may be made to "charge" in the dielectric of the ferroelectric capacitor, it should be noted that the capacitor charge dissipates, i.e. is volatile. However hysteresis curve 40 also represents polarization, which is non-volatile. Reference is made to both aspects of charge and polarization, which generally correspond before the charge on the capacitor dissipates.

In FIG. 1, the x-axis represents the field voltage applied to the ferroelectric dielectric material of the ferroelectric capacitor and the y-axis represents the polarization vector (or charge) of the ferroelectric material. The flow of current through a ferroelectric capacitor depends on the prior history of the applied voltages. A voltage waveform 47 is shown in FIG. 2 that includes two positive voltage pulses and two negative voltage pulses that are applied to one electrode of a ferroelectric capacitor in a Sawyer tower circuit arrangement, which is well known in the art. The exact timing of the pulses is arbitrary, and can include extremely long pulse widths. Circled point numbers one through six on hysteresis curve 40 correspond to the same circled point numbers on the voltage diagram of FIG. 2.

Starting at a first point 41 on both the hysteresis diagram 40 of FIG. 1 and the voltage diagram 47 of FIG. 2, there is no externally-applied voltage across the ferroelectric capacitor, but there was a previously-applied voltage across the ferroelectric capacitor that left the capacitor polarized at point 41. Applying a positive voltage across the capacitor moves the operating point (i.e., the current polarization) along the hysteresis curve 40 to a second point 42. The change in polarization vector or charge is designated "P" and is labeled on the rising edge of the first voltage pulse shown in FIG. 2 and on the hysteresis curve 40 shown in FIG. 1. The charge liberated with the change in polarization vector is referred to as the "switched charge." Next, the trailing edge of the first pulse in FIG. 2 occurs between circled numbers 2 and 3. This is typically a return-to-zero transition in the externally applied voltage. Removing such positive voltage moves the polarization along the hysteresis curve to a third point 43. The direction component of spontaneous remnant polarization within the ferroelectric material is unchanged, although there is some loss of field induced polarization, i.e. a loss in the polarization magnitude in a non-ideal ferroelectric material. The change in charge is designated "$P_a$" and is labeled on the falling edge of the first voltage pulse shown in FIG. 2 and on the hysteresis curve 40 shown in FIG. 1. Circled point 3 is at zero externally-applied volts and, while at zero on the horizontal (voltage) axis, has a non-zero vertical component. Ideally, this remnant polarization ought to remain indefinitely. However, in practice some relaxation may occur. This is shown in FIG. 1. Specifically, between the third and fourth points 43 and 44 on the hysteresis curve 40, there is a "relaxation" of domains within the ferroelectric material resulting in a partial loss of polarization magnitude.

Applying a second positive voltage across the ferroelectric dielectric material moves the operating point from the fourth point 44 on the curve 40 back to the second point 42. The increase in charge is now labeled "U" and is less than the P increase produced by the first positive voltage. Removing the applied positive voltage moves the operating point to the fifth point 45 on the hysteresis curve 40, with a corresponding loss of charge labeled "$U_a$".

Applying a negative voltage across the ferroelectric dielectric material at the fifth point 45 on the hysteresis curve 40 moves the operating point to a sixth point 46. The change in charge and polarization is labeled "N" and is shown on the leading edge of the first negative pulse in FIG. 2. The negative voltage reverses the polarization direction of the capacitor, resulting in the original polarization direction. Since the hysteresis curve is substantially symmetrical, removing and reapplying the negative voltage moves the operating point around the "bottom" portion of the hysteresis curve in the same manner as described above. The associated changes in charge around the loop 40 are consecutively labeled "N", "$N_a$", "D" and "$D_a$" in FIG. 2. Note that the relaxation of the loop is not shown in the bottom portion of loop 40, though it exists in a non-ideal ferroelectric material, and therefore the charge components labeled "$N_a$" "D" and "$D_a$" are assumed to all be approximately equal. After the two negative voltage pulses are applied and returned to zero applied volts, the operating point is returned to the first point 41 on the hysteresis curve 40.

In prior art reference circuits, the reference voltage, bit line voltage for switching, and bit line voltage for non-switching are generally associated with the Da, P, and U charge components of hysteresis loop 40 shown in FIG. 1, respectively. These three charge components have different temperature and voltage coefficients. In general, as temperature increases, the P component decreases and the U and Da components increase. When the memory operating voltage (VDD) increases, all three components increase, but the P component increases the most. Since the Da component is smaller than the U component, a much larger reference capacitor is needed to place the reference voltage above the bit line voltage for non-switching and below the bit line voltage for switching. The ratio of the capacitor size of the reference cell to the capacitor size of the memory cell is called the "scaling factor". As discussed, the scaling factor should be much be larger than one. It is desirably in the range of 1.5 to 5.0, depending on the circuit design. This scaling factor amplifies the temperature and voltage coefficient of the reference voltage. Therefore, in prior art designs, the reference voltage selection is limited to a reduced range in order for memory parts to work at a low temperature and low voltage and a high temperature and high voltage. In other words, the loss of a certain amount of signal margin is the cost for using these prior art reference circuits.

One of the long time reliability issues for ferroelectric reference circuits and ferroelectric memories in general is imprint. Imprint causes the opposite state P component to decrease and the opposite state U component to increase. Therefore, imprint effectively reduces the signal margin. Since the prior art reference circuits also cost signal margin, the opposite state retention time is also reduced.

In prior art reference circuits, when a memory cell on a column is accessed, the reference cell is also accessed. Therefore, reference cells bear a much higher electrical stress than do the memory cells. A more stable component in reference cells is thus needed. The reason that the Da charge component is used in the prior art reference circuits is based on a fact that Da does not fatigue. However, the ferroelectric memory cells use the "P" and "U" terms, which do have the potential of fatigue.

If, on the other hand, a reference is constructed that uses the P and U terms in order to track the memory cells, then the reference cell capacitor will fatigue, and the memory part will prematurely fail. Therefore, reference circuits that use the P and U terms, but have a reference capacitor that is accessed every time that a memory cell on the same column or same row is accessed, are not ideal for a commercial ferroelectric memory.

Another disadvantage in prior art reference circuits is that the optimized number of reference capacitors (or the size of reference capacitors, or the scaling factor) might be different from lot to lot. Additional cost is required to determine the optimized reference for each lot.

What is desired, therefore, is a reference circuit for a ferroelectric memory that accurately tracks the charge components of a ferroelectric memory cell so that voltage and temperature performance is optimized, but that does not fatigue resulting in premature failure of the ferroelectric memory.

SUMMARY OF THE INVENTION

According to an embodiment of the present invention, a ferroelectric reference circuit generates a reference voltage proportional to a (P+U)/2 charge term and is automatically centered between the bit line voltages corresponding to the P term and the U term across wide temperature and voltage ranges. To avoid fatiguing the reference ferroelectric capacitors generating the (P+U)/2 charge term, the reference voltage is refreshed periodically, such as once every millisecond. To eliminate the variation of the reference voltage due to the leakage in the ferroelectric capacitors during this period of time, the reference voltage generated from the reference ferroelectric capacitors is digitized when it is refreshed. The digital value is fixed and converted to an analog value which is then fed into sense amplifiers for resolving the data states. The reference voltage is automatically at the center of the switching (P) and non-switching (U) signals at any temperature and voltage, therefore the reference is signal margin "cost-free" and the signal margin is maximized.

The reference capacitors in an embodiment of the current invention are not more stressed than the memory capacitors. In the conventional circuits, the special concern is the fatigue of the P and U charge terms. The reduction of the P and U terms due to ferroelectric fatigue shifts the reference voltage lower and the endurance of the memory parts is affected. In an embodiment of the present invention, the reference capacitors are read from and written to only periodically, such as once per millisecond, resulting in non-fatigued P and U terms for an extended period. For instance, a pair of reference capacitors with an endurance of 1E12 cycles (with no considerable reduction in P and U) could generate a non-fatigued (P+U)/2 reference for 31.7 years.

The reference voltage of the present invention is kept at the same voltage between refreshes, so no extra time is needed to generate a reference voltage after chip enable as with some prior art reference circuits. Thus, the reference circuit of the present invention is suitable for fast memory operation.

In the voltage reference circuit of the present invention, separate reference bit lines are not needed. Thus, the shielding methodology taught in U.S. Pat. No. 6,717,839 entitled "Bit-line Shielding Method for Ferroelectric Memories", which is also incorporated by this reference, can be used to have coupling-free read operations.

In a ferroelectric memory using the reference circuit of the present invention, retention time is maximized due to the fact that the (P+U)/2 term is constant for same state and opposite state scenarios. After imprint, the increase in the U term is equivalent to the decrease in the P term. In other words, the reference voltage generated in the present invention is at the center of the P and U terms, even for an imprinted capacitor.

The reference capacitors used in the current invention are exactly the same size as the memory ferroelectric capacitors. There is no need to determine an optimum reference capacitor size in the production flow, as may be required in current programmable reference techniques.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
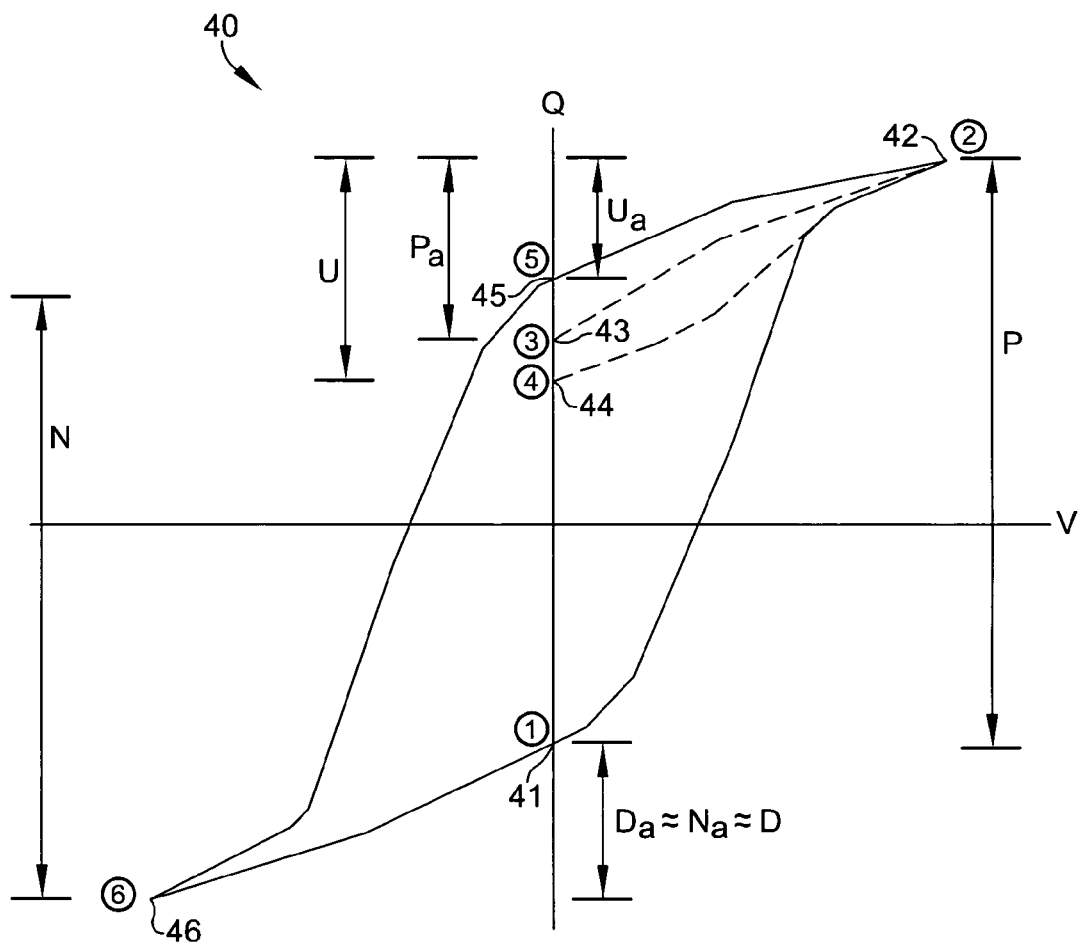
FIG. 1 is a hysteresis loop of a ferroelectric capacitor.
Figure 2:
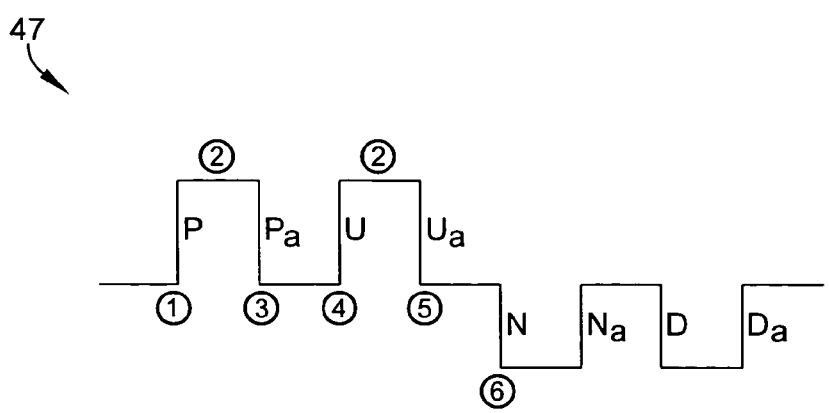
FIG. 2 is a pulsed waveform in which the pulse transitions correspond to the hysteresis loop of FIG. 1.
Figure 3:
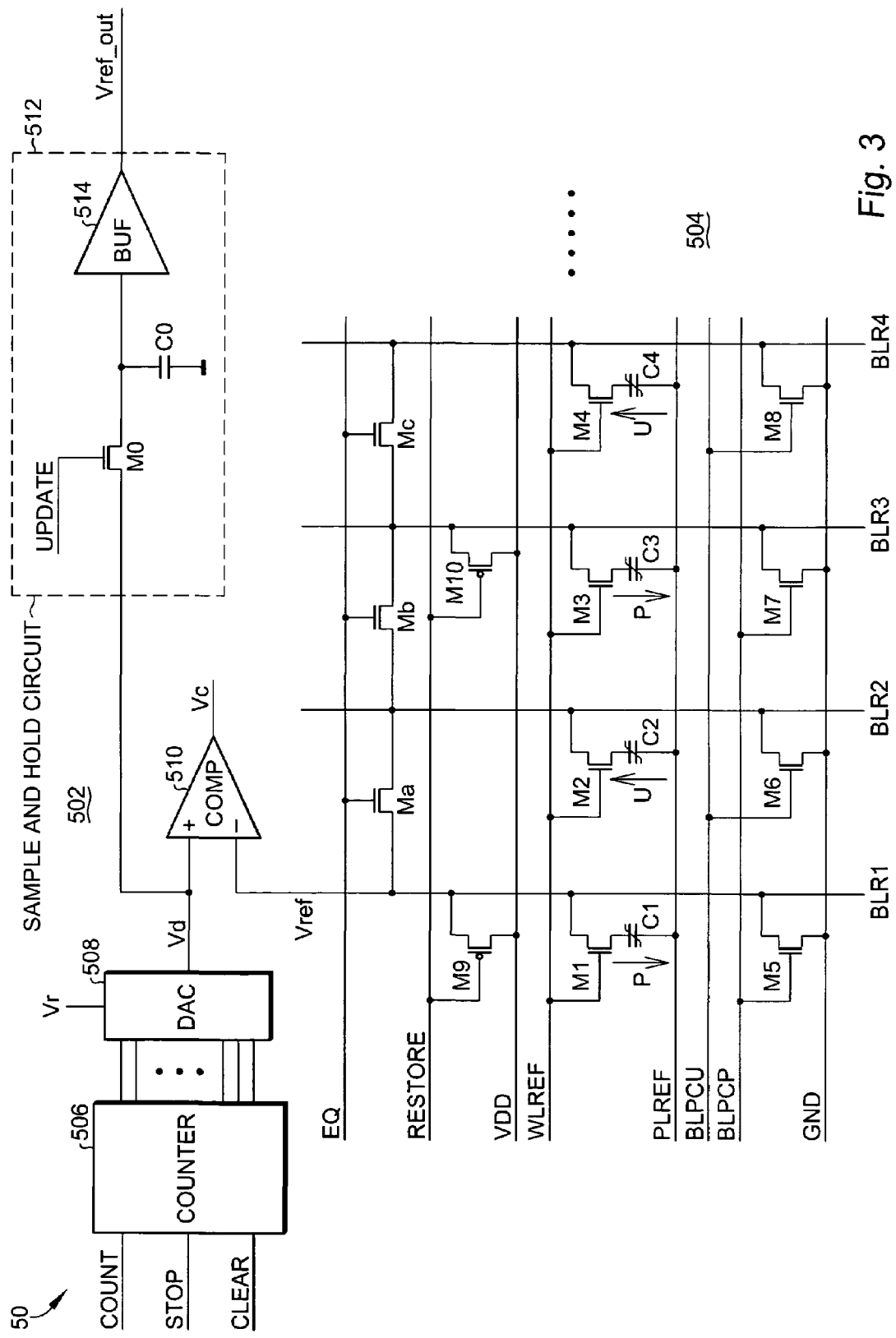
FIG. 3 is a schematic diagram of a reference circuit according to an embodiment of the present invention.

Referring now to FIG. 3, a reference circuit 50 for a ferroelectric memory includes a reference generating circuit 504 for generating a ferroelectric reference voltage and an "updating" or refresh circuit 504 coupled to the reference generating circuit through the VREF line for providing a periodically updated version of the ferroelectric reference voltage at the VREF_OUT output.

The reference generating circuit 504 includes at least two ferroelectric reference cells, each including a transistor and a ferroelectric capacitor. A first ferroelectric reference cell includes transistor M1 and ferroelectric capacitor C1. A second ferroelectric reference cell includes transistor M2 and ferroelectric capacitor C2. Any even number of ferroelectric reference cells may be used, as is explained in further detail, below. In the embodiment shown in FIG. 3 a third ferroelectric reference cell including transistor M3 and ferroelectric capacitor C3, as well as a fourth ferroelectric reference cell including transistor M4 and ferroelectric capacitor C4, are shown.

The reference generating circuit 504 includes a number of buses or lines for carrying various signals used in generating the initial reference voltage VREF. Reference generating circuit 504 includes a reference word line designated WLREF, a reference plate line designated PLREF, and at least two reference bit lines BLR1 and BLR2. In the embodiment shown in FIG. 3 additional bit lines BLR3 and BLR4 are shown. Additional reference bit lines are of course contemplated to correspond to additional reference cells as is also explained further, below.

Each of the ferroelectric reference cells is coupled to the reference word line, the reference plate line, and one of the reference bit lines. For example, the reference cell including transistor M1 and ferroelectric capacitor C1 is coupled in the following manner: the gate of transistor M1 is coupled to the WLREF word reference line; the source/drain of transistor M1 is coupled to the reference bit line BLR1; and the ferroelectric capacitor C1 is coupled to the reference plate line PLREF. As another example, the reference cell including transistor M4 and ferroelectric capacitor C4 is coupled in the following manner: the gate of transistor M4 is coupled to the WLREF word reference line; the source/drain of transistor M4 is coupled to the reference bit line BLR4; and the ferroelectric capacitor C4 is coupled to the reference plate line PLREF.

At least one of the reference bit lines, such as BLR1, provides the ferroelectric reference voltage VREF, although all of the reference bit lines are shorted together with transistors MA, MB, and MC under control of the EQ equalizing signal. In this way fluctuations from individual reference memory cell pairs are averaged out. Although transistors MA, MB and MC are shown as forming the equalizing circuit, additional transistors are contemplated if additional memory reference cells are used.

Additional signal and power lines include a RESTORE line, a VDD power supply line, and transistors M9 and M10 for restoring the voltage of bit lines BLR1 and BLR3. Lines BLPCU, BLPCP and ground are used to discharge the reference bit lines through transistors M5, M6, M7, and M8.

The updating or refresh circuit 504 includes a counter 506, a DAC 508 coupled to the counter 506, a comparator 510 having a first input coupled to an output of the DAC for receiving the VD voltage, a second input for receiving the VREF ferroelectric reference voltage, and an output for providing the VC output voltage which is used in controlling the counter 506, and a sample and hold circuit 512 having an input coupled to the output of the DAC, and an output for providing a periodically updated ferroelectric reference voltage designated VREF_OUT.

The sample and hold circuit 512 includes a transistor M0 having a first source/drain forming the input of the sample and hold circuit 512, a second source/drain, and a gate for receiving an UPDATE control signal, a capacitor C0 coupled between the second source/drain of transistor M0 and ground, and a buffer stage 514 having an input coupled to the second source/drain of transistor M0, and an output forming the output of the sample and hold circuit 512.

By definition, the charge term (P+U)/2 is in the center between the bit line voltages corresponding to the P term and the U charge terms. Since the reference capacitors C1, C2, C3, and C4 and the memory capacitors (not shown in FIG. 3) are exposed to the same ambient temperature, the (P+U)/2 charge term from the reference capacitors is automatically centered between the switching and non-switching charge from memory capacitors at any temperature. If the read voltage for the reference capacitors and memory capacitors is the same, the resultant (P+U)/2 charge term from the reference capacitors is also automatically centered between the switching and non-switching charge terms from the memory capacitors at any operating voltage (VDD). To assure that the same voltage is used for the reference and memory capacitors, the reference capacitors are accessed periodically, such as once per millisecond. Any changes occurring to the applied voltage in less than a millisecond are not likely to appreciably skew the reference voltage.

As shown in FIG. 3, a pair of ferroelectric capacitors C1 and C2 have the same size as the memory cell capacitors (not shown). In operation, the polarization vectors in ferroelectric capacitors C1 and C2 are poled in opposite directions. For example, C1 is poled downwards (P term) and C2 is poled upwards (U term). N-channel transistors M1 and M2 couple C1 and C2 to reference bit lines BLR1 and BLR2, respectively. The reference bit lines BLR1, BLR2, BLR3, and BLR4 have the same parasitic capacitance as the real bit lines. Dummy transistors, which are not shown in FIG. 3, are coupled to the reference bit lines to get equal parasitic capacitance. Ferroelectric capacitors C1 and C2 share the same plate line PLREF and the gates of transistors M1 and M2 are controlled by the same word line WLREF. N-channel transistor MA is used to short reference bit lines BLR1 and BLR2 when the EQ control signal is high. The structure described above can be duplicated as many times as desired to obtain the mean value of (P+U)/2 of all memory cells and to have optimal trade-off between the die size and distribution of the P and U terms across the die.

As previously described, FIG. 3 also shows an example of sample-and-hold circuit 512, which is constructed with transistor M0, capacitor C0, and an analog buffer 514. The function of the sample-and-hold circuit 512 is to hold the previous reference voltage during the generation of a new reference voltage. The updating of the reference voltage starts at turning transistor M0 off. After transistor M0 is turned off, capacitor C0 holds the value of VD. Buffer 514 is an analog voltage buffer and its output is equal to the voltage on capacitor C0. Thus, VREF_OUT is always kept at a valid reference level. After transistor M0 is off, the reference bit lines are discharged to ground by pulling the BLPCP and BLPCU lines high. Then, the BLPCP and BLPCU lines are driven low to float the reference bit lines. Then, the reference word line WLREF goes high. After some delay, the plate line PLREF is pulled high to transfer the P charge term from capacitor C1 and the U charge term from capacitor C2 to reference bit lines BLR1 and BLR2, respectively. Similarly, the charge terms on capacitors C3 and C4, (as well as any other reference capacitors) are transferred to the corresponding reference bit lines (if more pairs of reference capacitors are used). Then, reference word line WLREF is driven low and the EQ signal is pulled high to turn on transistors MA, MB, and MC (as well as any other equalization transistors).

Thus, the reference voltage VREF corresponding to the desired (P+U)/2 charge term is obtained by shorting all the reference bit lines together through transistors MA, MB and MC, as well as any other transistors. At the same time as word line reference WLREF goes high, counter 506 is cleared to a count of zero, using the CLEAR control signal input. When the VREF voltage is obtained, the counter starts counting up from a count of zero, using the COUNT control signal input. The number of output bits of counter 506 is determined by the desired resolution. As the digital output of the counter increases, the corresponding analog output voltage VD from the digital-to-analog conversion block DAC 508 also increases. As soon as the VD voltage becomes higher than the VREF voltage, the comparator 510 output voltage VC changes from a zero to a one. This voltage is fed back to the STOP control input of counter 506 to freeze the output of the counter. The analog output range of DAC 508 is from an initial zero volts to a final VR voltage. Thus, the VR final voltage is set higher than any possible desired value of the VREF voltage. After the STOP signal goes high, the UPDATE signal goes high and the VREF_OUT voltage is driven to VD volts. Finally, the reference bit lines are charged to either VDD by M9 and M10, or ground by M6 and M8, and the reference plate line PLREF is pulsed to restore the polarization vectors in the reference capacitors C1, C2, C3, and C4, as well as any other reference capacitors that may be used.

Figure 4:
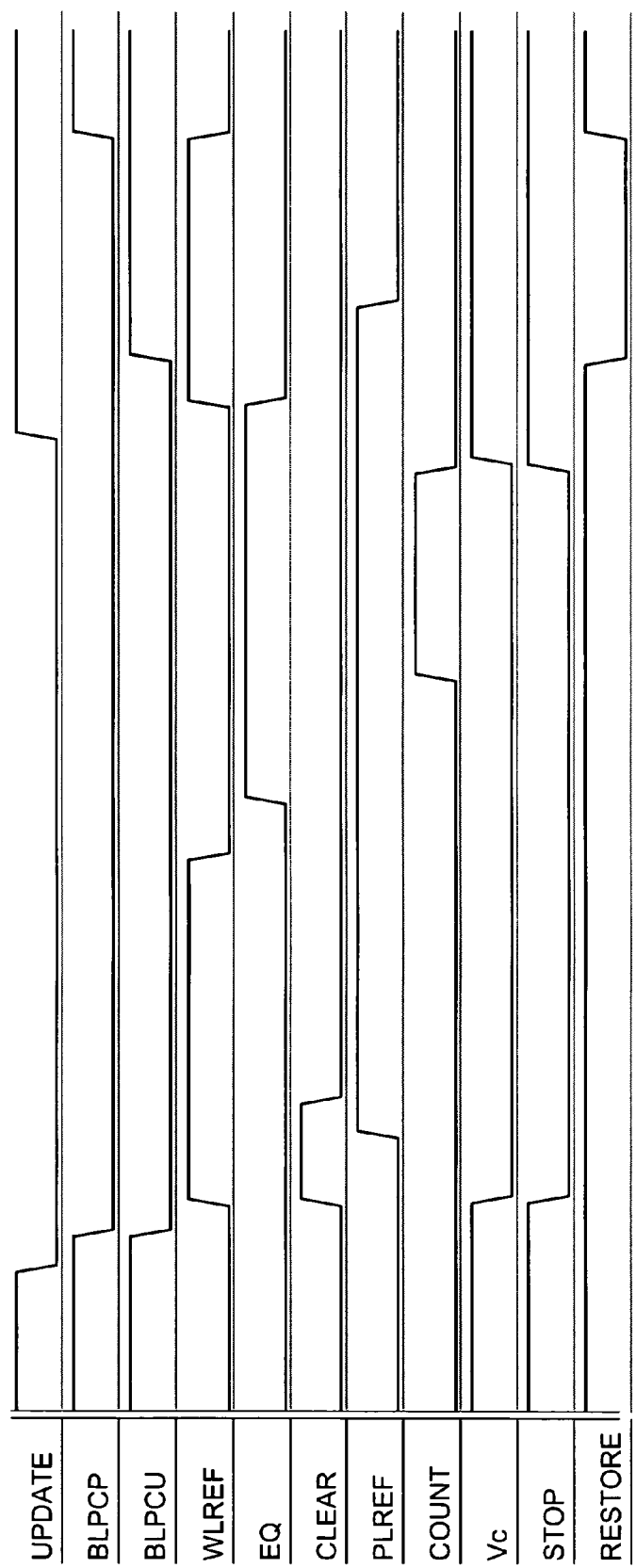
FIG. 4 is a timing diagram associated with the operation of the reference circuit shown in FIG. 3.

Referring now to FIG. 4, a timing diagram is shown corresponding to the operational procedure described above. The following voltage waveforms are shown, corresponding to the following designated signals: UPDATE, BLPCP, BLPCU, WLREF, EQ, CLEAR, PLREF, COUNT, VC, STOP, and RESTORE. The reference voltage VREF_OUT is coupled every time a new VREF is generated to trace the variations caused by temperature and the VDD.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A method of providing a reference for a ferroelectric memory comprising:
   generating a ferroelectric reference voltage;
   digitizing the ferroelectric reference voltage by,
      counting up from an initial value;
      comparing the count value to the generated ferroelectric reference voltage;
      stopping the count once the count value exceeds the generated ferroelectric reference voltage; and
      using the final count value as the digitized ferroelectric reference voltage; and
   periodically updating the digitized ferroelectric reference voltage.

2. The method of claim 1 further comprising periodically generating the ferroelectric reference voltage.

3. The method of claim 1 wherein generating a ferroelectric reference voltage comprises generating a reference voltage derived from the average of a "P" term and a "U" term.

4. The method of claim 1 wherein generating a ferroelectric reference voltage comprises generating a reference voltage derived from the average of a plurality of "P" terms and a plurality of "U" terms.

5. The method of claim 1 wherein generating a ferroelectric reference voltage comprises generating a reference voltage derived from the charge components of two ferroelectric capacitors.

6. The method of claim 5 further comprising selectively polarizing the two ferroelectric capacitors.

7. The method of claim 1 wherein generating a ferroelectric reference voltage comprises generating a reference voltage derived from the charge components of a plurality of ferroelectric capacitors.

8. The method of claim 7 further comprising selectively polarizing the plurality of ferroelectric capacitors.

9. The method of claim 1 wherein comparing the count value comprises comparing an analog version of the count value to the generated ferroelectric reference voltage.

10. The method of claim 1 wherein the digitized ferroelectric reference voltage is updated about once every millisecond.

11. The method of claim 1, wherein the step of generating a ferroelectric reference voltage comprises:
    alternately poling at least two ferroelectric capacitors; and
    transferring the charge from the two ferroelectric capacitors onto a reference line.

12. The method of claim 11 further comprising periodically poling the at least two ferroelectric capacitors.

* * * * *